United States Patent
Song

(10) Patent No.: US 7,605,418 B2
(45) Date of Patent: Oct. 20, 2009

(54) METHODS OF FABRICATING CAPACITOR

(75) Inventor: Yoo Seon Song, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 272 days.

(21) Appl. No.: 11/026,825

(22) Filed: Dec. 28, 2004

(65) Prior Publication Data

US 2005/0139887 A1 Jun. 30, 2005

(30) Foreign Application Priority Data

Dec. 31, 2003 (KR) .................. 10-2003-0101063

(51) Int. Cl.
*H01L 27/108* (2006.01)
*H01L 29/76* (2006.01)

(52) U.S. Cl. .................. 257/296; 257/301; 257/528; 257/532; 257/E27.016

(58) Field of Classification Search .......... 257/296, 257/301, 528, 532, E27.016
See application file for complete search history.

(56) References Cited

U.S. PATENT DOCUMENTS

| | | | |
|---|---|---|---|
| 6,103,622 A | 8/2000 | Huang | |
| 6,165,861 A | 12/2000 | Liu et al. | |
| 6,277,707 B1 * | 8/2001 | Lee et al. | 438/430 |
| 6,373,083 B1 | 4/2002 | Oh | |
| 6,492,224 B1 | 12/2002 | Jao | |
| 6,664,162 B2 * | 12/2003 | Okada | 438/243 |
| 2004/0232497 A1 * | 11/2004 | Akiyama et al. | 257/390 |
| 2006/0202248 A1 * | 9/2006 | Lee et al. | 257/296 |

FOREIGN PATENT DOCUMENTS

| | | |
|---|---|---|
| KR | 2002-0030420 A | 4/2002 |
| KR | 2003-0072111 A | 9/2003 |

OTHER PUBLICATIONS

Stanley Wolf, Silicon processing for the VSLI Era vol. 4 Lattice Press 2002 pp. 145-146.*
Yong Chan Kim; Semiconductor Device and Fabricating Method Thereof; Korean Patent Abstracts; Publication No. 10-2002-0030420 A, Apr. 25, 2002, 8 pages; Korean Intellectual Property Office, Korea.

(Continued)

*Primary Examiner*—David S Blum
(74) *Attorney, Agent, or Firm*—The Law Offices of Andrew D. Fortney; Andrew D. Fortney; Duangkamol Kay Strohl

(57) ABSTRACT

A fabricating method of a capacitor is disclosed. Particularly, a fabricating method of a capacitor which forms a capacitor in the place where the insulation layer of an STI region is removed, preventing interlayer dielectric layers from becoming thick. A disclosed method comprises: defining an STI region in the predetermined region of a substrate; removing the insulation layer of the STI region where a capacitor will be formed; forming a gate insulation layer and a first polysilicon layer on the substrate, and patterning the first polysilicon layer; and forming a first insulation layer and a second polysilicon layer on the substrate, and patterning the first insulation layer and the second polysilicon layer.

19 Claims, 4 Drawing Sheets

OTHER PUBLICATIONS

Il Seok Han; Method for Manufacturing Analog Semiconductor Device Using Buffer Polysilicon Layer; Korean Patent Abstracts; Publication No. 10-2002-0072111 A, Sep. 13, 2003, 13 pages; Korean Intellectual Property Office, Korea.

Bo Seok Oh; Capacitor and Method of Forming the Same: Korean Patent Abstracts: Publication No. 1020000066725A; Publication Date Nov. 15, 2000; Korean Intellectual Property Office.

Bo Seok Oh; Method for Manufacturing Capacitor; Korean Patent Abstracts; Publication No. 1020000024643A; Publication Date May 6, 2000; Korean Intellectual Property Office.

Korean Office Action; Korean Application No. 10-2003-0101063, Dated Oct. 31, 2005; Korean Intellectual Property Office, Republic of Korea.

* cited by examiner

US 7,605,418 B2

METHODS OF FABRICATING CAPACITOR

BACKGROUND OF THE INVENTION

1. Field of the Invention

The present invention relates to a capacitor and a method of fabricating the same, and more particularly, to a capacitor in a shallow trench isolation (hereinafter referred to as "STI") region, and a method of fabricating the same. The present invention may increase the capacitance per unit area of the capacitor, and/or may reduce an interlayer dielectric layers thickness.

2. Background of the Related Art

Referring to FIG. 1a, a field oxide layer 11 and a gate oxide layer 12 are formed for the insulation between devices on a semiconductor substrate 10. A first polysilicon layer 13, which may be used as a gate electrode and a lower electrode of a capacitor, is deposited on the gate oxide layer 12 and doped.

Referring to FIG. 1b, using a selective dry etch process and a mask, a gate electrode 14 is formed on the gate oxide layer 12 and a lower electrode 15 of a poly-insulator-poly (hereinafter referred to as "PIP") capacitor is formed on the field oxide layer 11.

Referring to FIG. 1c, an insulation layer 16 is blanket deposited on the substrate, including where the gate electrode 14 and the polysilicon lower electrode 15 are formed. The insulation layer 16 may be formed by depositing an oxide layer (e.g., $SiO_2$) using a LPCVD (low pressure chemical vapor deposition) process.

Referring to FIG. 1d, a second polysilicon layer 17 for an upper electrode of a PIP capacitor is deposited on the insulation layer 16.

Referring to FIG. 1e, the upper electrode 18 of a PIP capacitor is formed using a selective dry etch process and a mask. During a second stage of the etch process, the insulation layer 16 (except under the upper electrode 18) is removed.

Referring to FIG. 1f, a source and a drain of a MOS transistor are formed using an ion implantation process, and an insulation layer 20 (e.g., comprising TEOS (tetra-ethyl-ortho-silicate) layer and/or a BPSG (borophosphosilicate glass) is formed through a CVD (chemical vapor deposition) process. Contact holes are formed to connect overlying metal interconnects with the source, the drain, and the lower electrode of the PIP capacitor. Contact plugs 19 are then formed by filling metals into the contact holes.

Korean Patent Publication No. 2003-0072111 describes a method of fabricating a PIP capacitor on a field oxide layer. More particularly, the method reduces resistance-capacitance (hereinafter referred to as "RC") delay and gate sheet resistance by implanting $POCl_3$ ions or P ions into the polysilicon layer of a gate electrode and a capacitor. Korean Patent Publication No. 2002-0030420 describes a method which enhances the linear characteristic of a capacitor by forming the lower electrode of a capacitor with a silicon layer and a silicide layer, and forming the upper electrode of the capacitor with a metal. U.S. Pat. No. 6,492,224 describes a method of fabricating the lower electrode of a capacitor by etching the insulation layer of an STI region, then filling the etched trench with polysilicon.

However, in the prior method(s) of fabricating both a PIP capacitor and a MOS transistor, the PIP capacitor is formed on the field oxide layer or on the STI layer, and both a gate electrode and at least one polysilicon layer of a capacitor are formed using the same polysilicon layer. Consequently, when the lower electrode of the capacitor and the gate are formed from the same polysilicon layer, a height profile difference between the gate electrode and the capacitor arises, plasma damage may be caused, and the interlayer dielectric may thicken, making contact plug formation more difficult.

SUMMARY OF THE INVENTION

Accordingly, the present invention is directed to a capacitor and a method of fabricating the same that substantially obviates one or more problems due to limitations and disadvantages of the related art.

An object of the present invention is to provide a capacitor and method of fabricating the same which prevents interlayer dielectric layers from thickening and embodies a capacitor with high capacitance. These objects may be achieved by fabricating a capacitor in a STI trench.

To achieve these objects and other advantages and in accordance with the purpose of the invention, as embodied and broadly described herein, a fabricating method of a capacitor comprises: defining an STI region in a substrate; removing an insulation layer of the STI region where a capacitor will be formed; forming a gate insulation layer and a first polysilicon layer on the substrate, and patterning the first polysilicon layer; and forming a first insulation layer and a second polysilicon layer on the substrate, and patterning the first insulation layer and the second polysilicon layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENT

Reference will now be made in detail to the preferred embodiments of the present invention, examples of which are illustrated in the accompanying drawings.

Figure 1A:
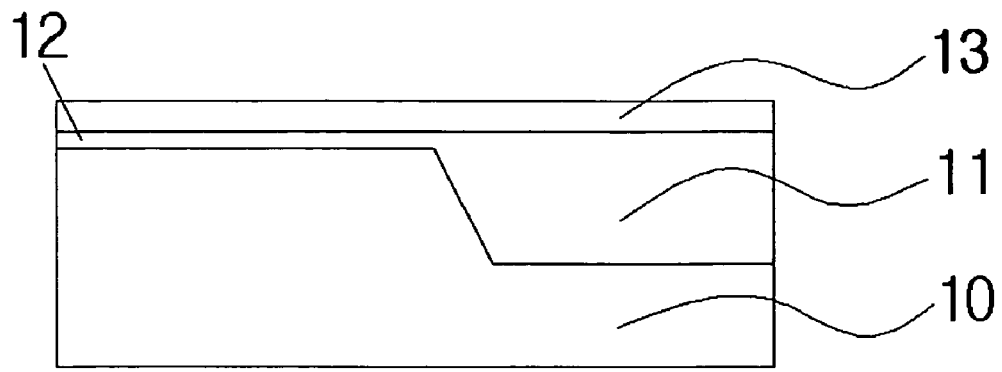
FIG. 1a through FIG. 1f are cross-sectional views illustrating a conventional example of fabricating a PIP capacitor and a gate electrode.
Figure 1B:
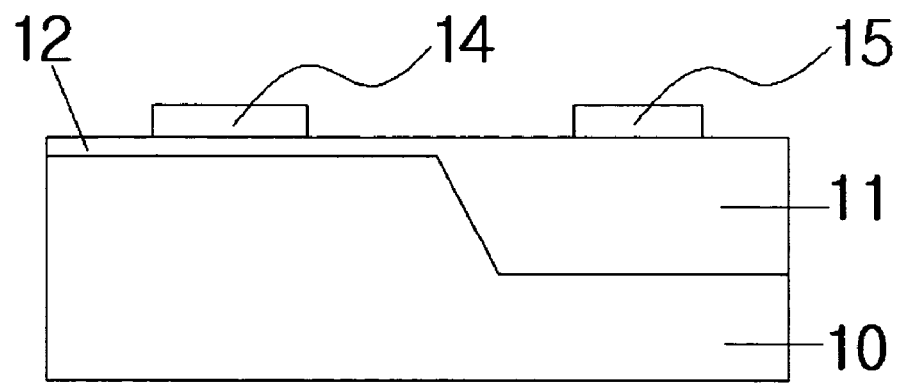
Figure 1C:
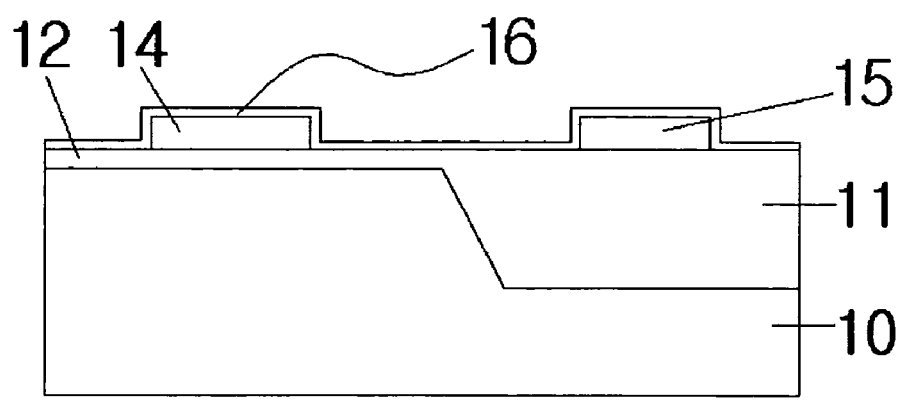
Figure 1D:
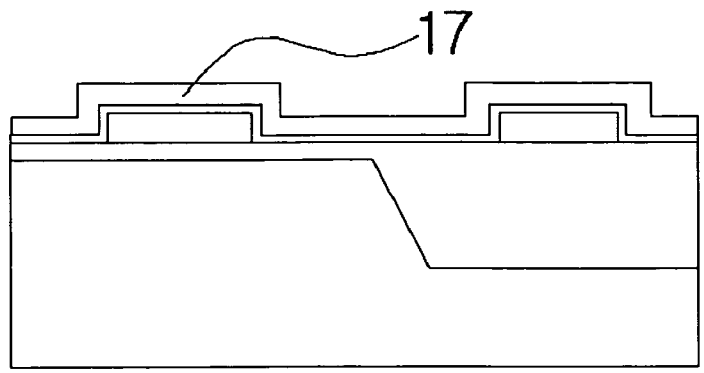
Figure 1E:
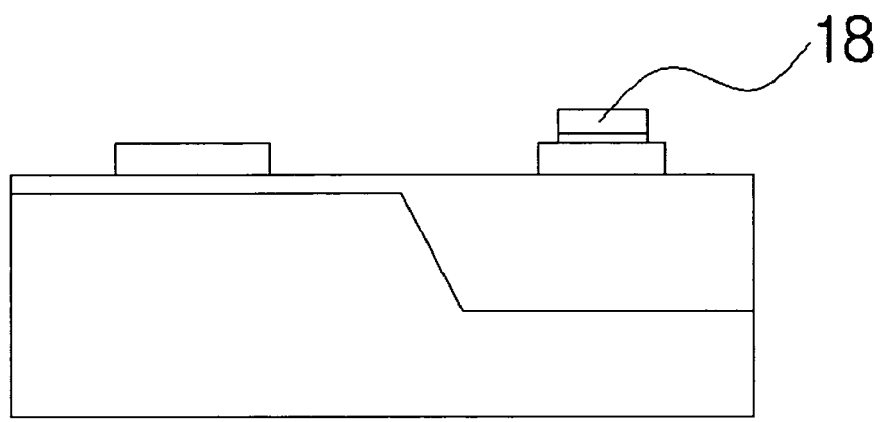
Figure 1F:
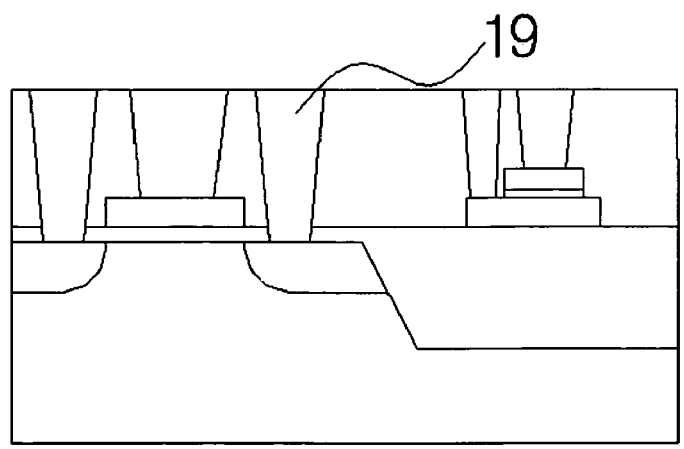
Figure 2A:
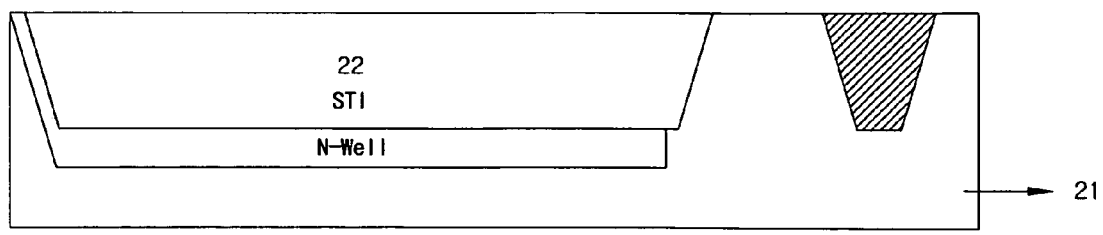
FIG. 2a through FIG. 2e are cross-sectional views illustrating an example of the present process of fabricating a capacitor in accordance with an embodiment of the present invention.

Referring to FIG. 2a, an STI region 22 is defined for device isolation in a predetermined region of a semiconductor substrate 21. Next, a conductive well 30 is formed in the semiconductor substrate 21 and an ion implantation process is performed to adjust the threshold voltage of a device (not shown). In the STI region for forming a capacitor, conductive well 30 may form a lower electrode of the capacitor. Because a capacitor will be formed in the STI region 22, the STI region 22 should have space enough for the capacitor.

Figure 2B:
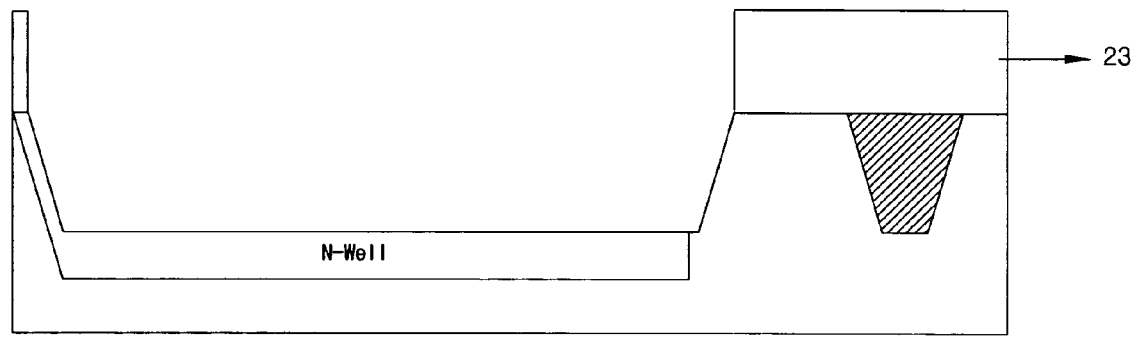

Referring to FIG. 2b, after the substrate in which the STI region is formed is coated with a photoresist 23, the photoresist is patterned using a reticle and an exposure and development process to expose the STI region for a capacitor. The insulation layer of the STI region for a capacitor and the photoresist pattern are then removed respectively by a wet etch.

Figure 2C:
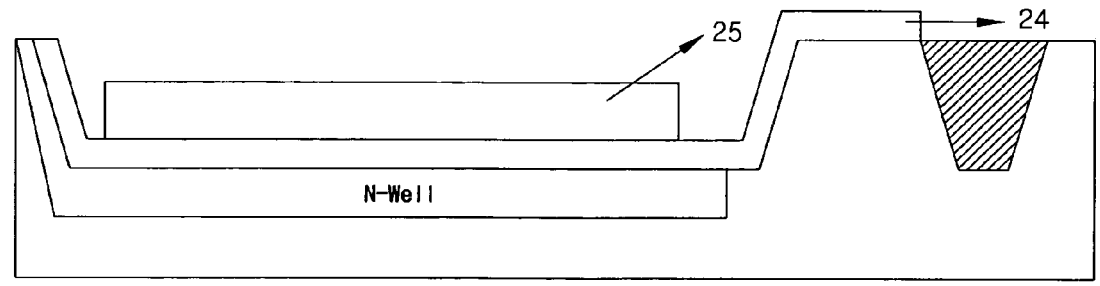

Referring to FIG. 2c, a gate insulation layer 24 is formed on the substrate, except for the regions where the insulation layer of the STI still remains. A first polysilicon layer is blanket-deposited on the gate insulation layer 24, and then a patterning process is carried out to form an intermediate capacitor electrode 25. Preferably, the gate insulation layer 24 is grown by a thermal oxidation process.

Figure 2D:
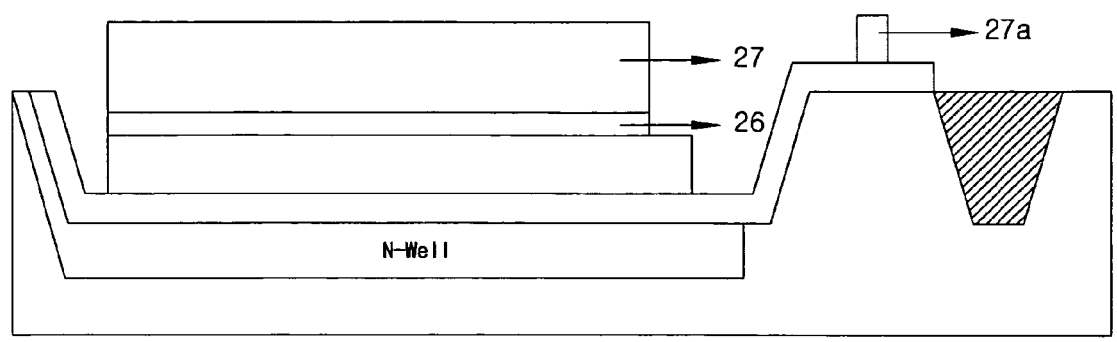

Referring to FIG. 2d, a first insulation layer 26 as a capacitor dielectric is deposited on the first polysilicon layer 25, and a second polysilicon layer 27 is deposited on the first insulation layer 26. The second polysilicon layer and the first insulation layer are then patterned, preferably such that an area of first polysilicon layer 25 sufficient to form a via thereto is uncovered by second polysilicon layer 27 and first insulation layer 26. The first insulation layer 26 functions as the dielectric layer of a PIP capacitor, and preferably has an oxide-nitride-oxide (hereinafter referred to as "ONO") structure. However, if necessary, the first insulation layer may comprise a transition element oxide, rare earth element oxide or a ferroelectric such as $BaTiO_3$, $PbTiO_3$ and $SrTiO_3$. Here, a transistor gate 27a is simultaneously patterned with the second polysilicon layer 27.

If the second polysilicon layer is deposited after the first polysilicon layer has been patterned to the height of the substrate, not only the upper capacitor electrode and the gate electrode may be simultaneously formed, but also misformation of contacts may be reduced in a subsequent contact plug forming process. Furthermore, when the capacitor electrodes are formed from the first and second polysilicon layers in a STI trench region, the degree of semiconductor device integration and/or capacitance, which depends on the contact area between electrodes, and space for forming contact plugs to such electrodes are preferably considered.

Figure 2E:
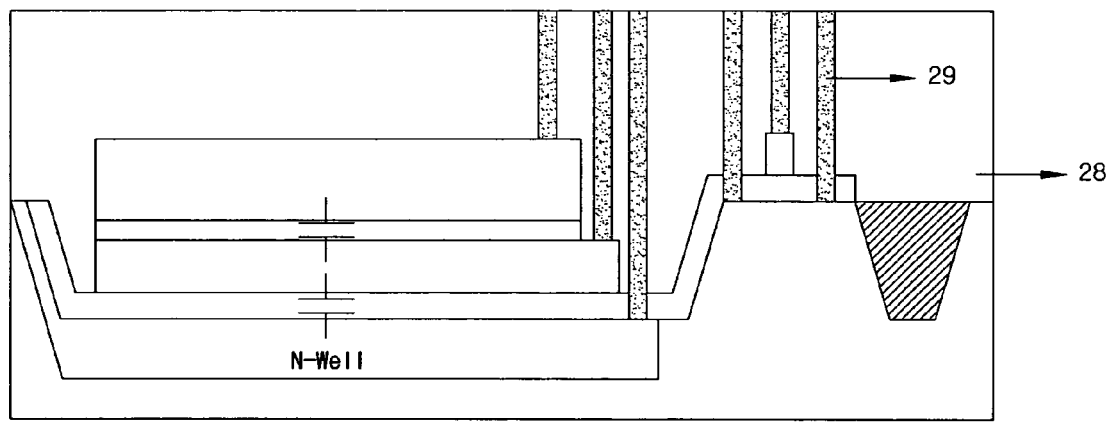

Referring to FIG. 2e, after an interlayer dielectric layer 28 is deposited over the substrate (including where the capacitor has been completed), contact holes are formed by patterning the interlayer dielectric layer. Next, a metal layer is deposited on the substrate and is planarized to form the contact plugs 29. The patterning process of the interlayer dielectric layer is carried out by considering both the contact plugs for the capacitor electrodes and the contact plugs for the transistor.

Accordingly, the disclosed methods prevent interlayer dielectric layers from unnecessarily thickening by fabricating a capacitor in the place where the insulation layer of an STI region has been removed. In addition, capacitance may be twice as large as that of a conventional two-electrode capacitor. This is because two capacitors, one capacitor comprising the first polysilicon layer and the second polysilicon layer and another capacitor comprising the first polysilicon layer and the conductive well in the lower part of the substrate, are simultaneously made.

It is noted that this patent claims priority from Korean Patent Application Serial Number 10-2003-0101063, which was field on Dec. 31, 2003, and is hereby incorporated by reference in its entirety.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A capacitor, comprising:
   a conductive well below an STI region in a substrate, the conductive well forming a bottom capacitor electrode;
   a first capacitor insulation layer in the STI region;
   an intermediate capacitor electrode on the first capacitor insulation layer having a side surface not in contact with the first capacitor insulation layer;
   a second capacitor insulation layer on the intermediate capacitor electrode;
   an upper capacitor electrode on the second capacitor insulation layer; and
   a third insulator layer having first, second and third vias respectively communicating with the conductive well and the intermediate and upper capacitor electrodes, wherein the first via directly communicates with the conductive well.

2. A capacitor as defined by claim 1, wherein the second capacitor insulation layer comprises a member selected from the group consisting of an oxide-nitride-oxide (ONO) layer, a transition element oxide, a rare earth element oxide, and a ferroelectric.

3. A capacitor as defined by claim 2, wherein the intermediate capacitor electrode has an area smaller than the conductive well, and the upper capacitor electrode has an area smaller than the intermediate capacitor electrode.

4. A capacitor as defined by claim 2, wherein the first capacitor insulation layer has a uniform thickness.

5. A capacitor as defined by claim 1, wherein the first capacitor insulation layer is continuous with a gate insulation layer.

6. A capacitor as defined by claim 5, wherein the first capacitor insulation layer is substantially the same as the gate insulation layer.

7. A capacitor as defined by claim 5, further comprising a gate electrode on the gate insulation layer.

8. A capacitor as defined by claim 7, wherein the gate electrode comprises a same material as the upper capacitor electrode.

9. A capacitor as defined by claim 8, wherein the gate electrode has an upper surface coplanar with the upper capacitor electrode.

10. A capacitor, comprising:
    a conductive well below an STI region in a substrate, the conductive well forming a bottom capacitor electrode;
    a first capacitor insulation layer in the STI region;
    an intermediate capacitor electrode on the first capacitor insulation layer;
    a second capacitor insulation layer on the intermediate capacitor electrode, the second capacitor insulation layer having an area smaller than the first capacitor electrode;
    an upper capacitor electrode on the second capacitor insulation layer; and
    a third insulator layer having first, second and third vias respectively communicating with the conductive well and the intermediate and upper capacitor electrodes, wherein the first via directly communicates with the conductive well.

11. A capacitor as defined by claim 10, wherein the first capacitor insulation layer comprises a member selected from the group consisting of an oxide-nitride-oxide (ONO) layer, a transition element oxide, a rare earth element oxide, $BaTiO_3$, $PbTiO_3$, and $SrTiO_3$.

12. A capacitor as defined by claim 10, wherein the intermediate capacitor electrode has an area smaller than the conductive well.

13. A capacitor as defined by claim 10, wherein the first capacitor insulation layer has a uniform thickness.

14. A capacitor as defined by claim 10, wherein the intermediate capacitor electrode has a side surface not in contact with the first capacitor insulation layer.

15. A capacitor as defined by claim 10, wherein the first capacitor insulation layer is continuous with a gate insulation layer.

16. A capacitor as defined by claim 15, wherein the first capacitor insulation layer is substantially the same as the gate insulation layer.

17. A capacitor as defined by claim 15, further comprising a gate electrode on the gate insulation layer.

18. A capacitor as defined by claim 17, wherein the gate electrode comprises a same material as the upper capacitor electrode.

19. A capacitor as defined by claim 18, wherein the gate electrode has an upper surface coplanar with the upper capacitor electrode.

* * * * *